US010126360B2

(12) United States Patent
Vickers (10) Patent No.: US 10,126,360 B2
(45) Date of Patent: Nov. 13, 2018

(54) SYSTEMS AND METHOD FOR LASER VOLTAGE IMAGING

(71) Applicant: FEI EFA, Inc., Fremont, CA (US)

(72) Inventor: James S. Vickers, San Jose, CA (US)

(73) Assignee: FEI EFA, Inc., Fremont, CA (US)

( * ) Notice: Subject to any disclaimer, the term of this patent is extended or adjusted under 35 U.S.C. 154(b) by 0 days.

(21) Appl. No.: 14/885,873

(22) Filed: Oct. 16, 2015

(65) Prior Publication Data

US 2016/0109513 A1   Apr. 21, 2016

Related U.S. Application Data

(60) Provisional application No. 62/064,663, filed on Oct. 16, 2014.

(51) Int. Cl.
*G01R 31/311* (2006.01)
*G01R 31/28* (2006.01)

(52) U.S. Cl.
CPC ........ *G01R 31/311* (2013.01); *G01R 31/2834* (2013.01)

(58) Field of Classification Search
None
See application file for complete search history.

(56) References Cited

U.S. PATENT DOCUMENTS

| 5,208,648 | A | 5/1993 | Batchelder et al. |
| 5,220,403 | A | 6/1993 | Batchelder et al. |
| 5,940,545 | A | 8/1999 | Kash et al. |
| 7,616,312 | B2* | 11/2009 | Kasapi ............... G01R 31/308 356/369 |
| 2007/0046301 | A1* | 3/2007 | Kasapi ............... G01R 31/308 324/754.22 |
| 2007/0046947 | A1* | 3/2007 | Lo ..................... G01R 31/307 356/492 |
| 2009/0245302 | A1 | 10/2009 | Baird et al. |
| 2010/0117667 | A1* | 5/2010 | Lo ..................... G01R 31/311 324/754.23 |

(Continued)

FOREIGN PATENT DOCUMENTS

| TW | 201140068 | 11/2011 |
| TW | I426710 | 2/2014 |
| WO | WO 2013/188046 | 12/2013 |

OTHER PUBLICATIONS

Kolachina et al., "Optical Waveform Probing—Strategies for Non-Flipchip Devices and Other Applications," International Symposium for Testing and Failure Analysis (ISTFA), pp. 51-57 (2001).

(Continued)

*Primary Examiner* — Paresh Patel
(74) *Attorney, Agent, or Firm* — Klarquist Sparkman, LLP (57) ABSTRACT

An apparatus and method for laser voltage testing of a DUT is disclosed. The system enables laser voltage probing and laser voltage imaging of devices within the DUT. A selected area of the DUT is illuminating a while the DUT is receiving test signals causing certain of the active devices to modulate. Light reflected from the DUT is collected and is converted into an electrical signal. The electrical signal is sampled by an ADC and the output of the ADC is sent to an FPGA. The FPGA operates on the signal so as to provide an output that emulates a spectrum analyzer or a vector analyzer.

29 Claims, 5 Drawing Sheets

(56) References Cited

U.S. PATENT DOCUMENTS

2011/0133766 A1 6/2011 Josefosky et al.
2012/0038892 A1* 2/2012 Kurtz ............... H04N 9/3105
353/31

OTHER PUBLICATIONS

Black et al., "Optical Sampling of GHz Charge Density Modulation in Silicon Bipolar Junction Transistors," Electron. Lett. 23:783-784 (1987).
Bruce et al., "Waveform Acquisition from the Backside of Silicon Using Electro-Optic Probing," International Symposium for Testing and Failure Analysis (ISTFA), pp. 19-25 (1999).
Heinrich, "Picosecond Noninvasive Optical Detection of Internal Electrical Signals in Flip-Chip-Mounted Silicon Integrated Circuits," IBM J. Res. Develop. 34:162-172 (1990).
Heinrich et al., "Erratum: Noninvasive sheet charge density probe for integrated silicon devices," *Applied Physics Letters*, 48:1811 (1986).
Heinrich et al., "Measurement of real-time digital signals in a silicon bipolar junction transistor using a noninvasive optical probe," Electron. Lett. 22:650-652 (1986).
Heinrich et al., "Noninvasive sheet charge density probe for integrated silicon devices," Appl. Phys. Lett. 48:1066-1068 (1986).
Hemenway et al., "Optical detection of charge modulation in silicon integrated circuits using a multimode laser-diode probe," IEEE Electron Device Letters 8:344-346 (1987).
Kasapi et al., "Laser Beam Backside Probing of CMOS Integrated Circuits," Microelectronics Reliability, 39:957 (1999).
Kindereit et al., "Comparison of Laser Voltage Probing and Mapping Results in Oversized and Minimum Size Devices of 120 nm and 65 nm Technology," Microelectronics Reliability 48, pp. 1322-1326 (2008).
Office Action from Taiwan Application No. 104133916, dated Dec. 22, 2016, 12 pages (with English translation).
Soref and Bennett, "Electrooptical Effects in Silicon," IEEE J. of Quantum Electron. QE-23:123-129 (1987).
Wilsher et al., "Integrated Circuit Waveform Probing Using Optical Phase Shift Detection," International Symposium for Testing and Failure Analysis (ISTFA), pp. 479-485 (2000).
Yee et al., "Laser Voltage Probe (LVP): A Novel Optical Probing Technology for Flip-Chip Packaged Microprocessors," International Symposium for Testing and Failure Analysis (ISTFA), pp. 3-8 (2000).

* cited by examiner

SYSTEMS AND METHOD FOR LASER VOLTAGE IMAGING

CROSS-REFERENCE TO RELATED APPLICATIONS

This application claims the benefit of priority from U.S. Provisional Patent Application Ser. No. 62/064,663, filed on Oct. 16, 2014, the entire disclosure of which is relied upon and incorporated herein by reference.

This application is related to U.S. Pat. No. 8,754,633, the disclosure of which is hereby incorporated herein by reference in its entirety.

BACKGROUND

1. Field of the Invention

The present invention relates to an apparatus and method for probing integrated circuits using laser illumination, wherein reflected laser light is modulated by switching of an active device under test (DUT).

2. Description of the Related Art

Probing systems have been used in the art for testing and debugging integrated circuit (IC) designs and layouts. Various laser-based systems for probing IC's are known in the prior art. While some description of the prior art is provided herein, the reader is encouraged to also review U.S. Pat. Nos. 5,208,648, 5,220,403 and 5,940,545, which are incorporated herein by reference in their entirety. Additional related information can be found in Yee, W. M., et al. *Laser Voltage Probe (LVP): A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of Silicon Using Electro-Optic Probing*, in International Symposium for Testing and Failure Analysis (ISTFA), 1999, p 19-25; Kolachina, S. et al. *Optical Waveform Probing—Strategies for Non-Flipchip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., Laser Beam Backside Probing of CMOS Integrated Circuits. Microelectronics Reliability, 1999. 39: p. 957; Wilsher, K., et al. Integrated Circuit Waveform Probing Using Optical Phase Shift Detection, in International Symposium for Testing and Failure Analysis (ISTFA), 2000, p 479-85; Heinrich, H. K., Picosecond Noninvasive Optical Detection of Internal Electrical Signals in Flip-Chip-Mounted Silicon Integrated Circuits. IBM Journal of Research and Development, 1990. 34(2/3): p. 162-72; Heinrich, H. K., D. M. Bloom, and B. R. Hemenway, Noninvasive sheet charge density probe for integrated silicon devices. Applied Physics Letters, 1986. 48(16): p. 1066-1068; Heinrich, H. K., D. M. Bloom, and B. R. Hemenway, Erratum to Noninvasive sheet charge density probe for integrated silicon devices. Applied Physics Letters, 1986. 48(26): p. 1811; Heinrich, H. K., et al., Measurement of real-time digital signals in a silicon bipolar junction transistor using a noninvasive optical probe. IEEE Electron Device Letters, 1986. 22(12): p. 650-652; Hemenway, B. R., et al., Optical detection of charge modulation in silicon integrated circuits using a multimode laser-diode probe. IEEE Electron Device Letters, 1987. 8(8): p. 344-346; A. Black, C. Courville, G Schultheis, H. Heinrich, Optical Sampling of GHz Charge Density Modulation in SIlicon Bipolar Junction Transistors Electronics Letters, 1987, Vol. 23, No. 15, p. 783-784, which are incorporated herein by reference in their entirety and Kindereit U, Boit C, Kerst U, Kasapi S, Ispasoiu R, Ng R, Lo W, Comparison of Laser Voltage Probing and Mapping Results in Oversized and Minimum Size Devices of 120 nm and 65 nm Technology, Microelectronics Reliability 48 (2008) 1322-1326, 19th European Symposium on Reliability of Electron Devices, Failure Physics and Analysis (ESREF 2008).

As is known, during debug and testing of an IC, a commercially available testing platform, such as, e.g., Automated Testing Equipment, also known as an Automated Testing and Evaluation (ATE) tester, is used to generate test patterns (also referred to as test vectors) to be applied to the IC device under test (DUT). Various systems and methods can then be used to test the response of the DUT to the test vectors. One such method is generally referred to as laser voltage probing (LVP). When a laser-based system such as an LVP is used for probing, the DUT is illuminated by the laser and the light reflected from the DUT is collected by the probing system. As the laser beam strikes the DUT, the laser beam is modulated by the response of various elements (switching transistors) of the DUT to the test vectors. This has been ascribed to the electrical modulation of the free carrier density, and the resultant perturbation of the index of refraction and absorption coefficient of the material of the IC, most commonly silicon. Accordingly, analysis of the reflected light provides information about the operation of various devices in the DUT.

Figure 1:
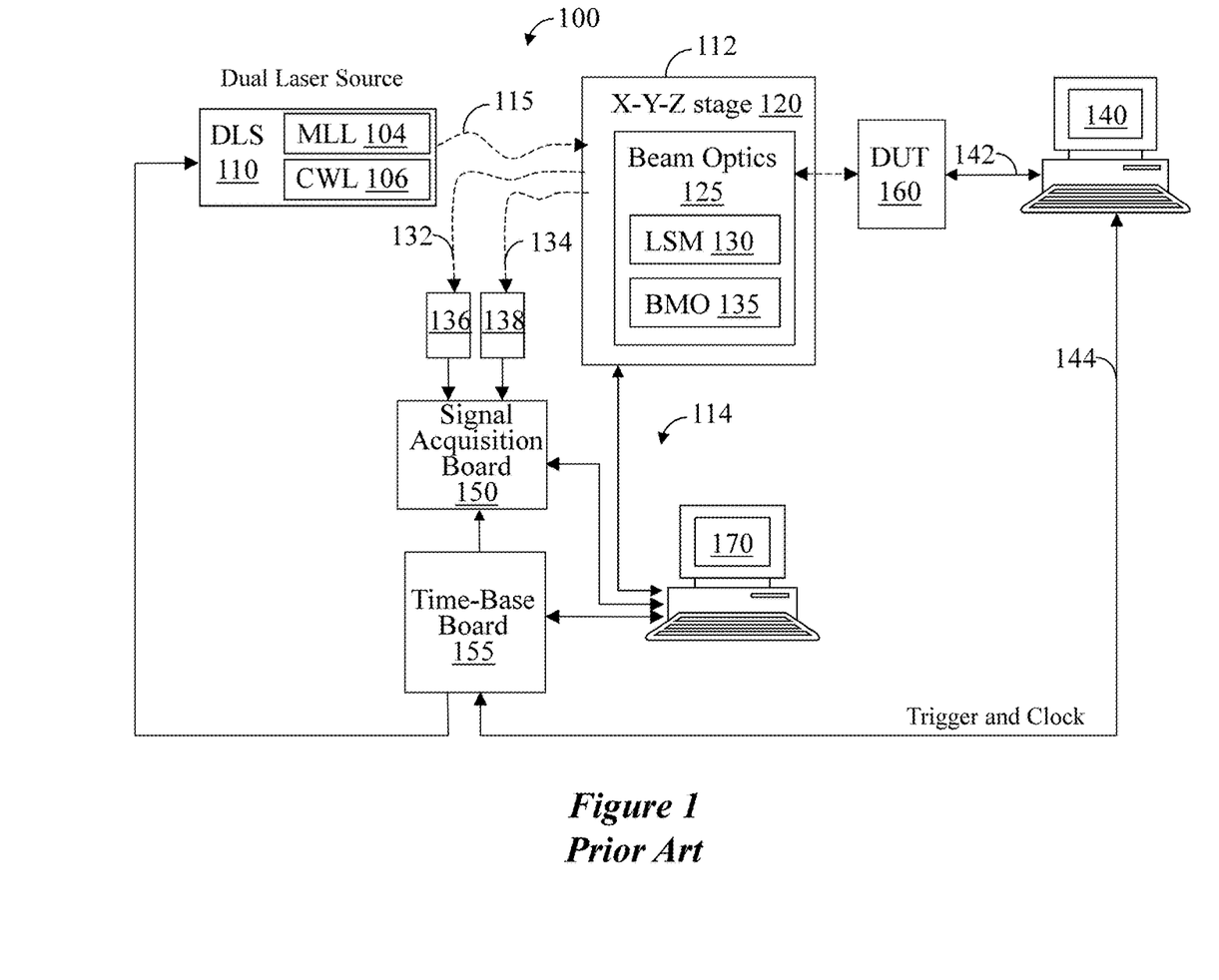
FIG. 1 is a general schematic depicting major components of a laser-based voltage probe system architecture according to the prior art.

FIG. 1 is a general schematic depicting major components of a laser-based voltage probe system architecture, 100, according to the prior art. In FIG. 1, dashed arrows represent optical path, while solid arrows represent electronic signal path. The optical paths represented by curved lines are generally made using fiber optic cables. Probe system 100 comprises a laser source which, in this particular example, is a dual laser source, DLS 110, an optical bench 112, and data acquisition and analysis apparatus 114. The optical bench 112 includes provisions for mounting the DUT 160.

A conventional ATE tester 140 provides stimulus signals 142 to and receives response signals from the DUT 160 and may provide trigger and clock signals, 144, to the time-base board 155. The signal from the tester is generally transferred to the DUT via test boards, DUT board (adapter plate) and various cables and interfaces that connect all of these components. Generally, the ATE and the LVP systems are produced and sold by different and unrelated companies. Thus, the reference to the description of embodiments of the inventive system relate only to the LVP, and not to the ATE. That is, the ATE is not part of the probe system 100.

Turning back to the probe system 100, the time-base board 155 synchronizes the signal acquisition with the DUT stimulus and the laser pulses. Controller 170 controls as well as receives, processes, and displays data from the signal acquisition board 150, time-base board 155, and the optical bench 112.

The various elements of probe system 100 will now be described in more detail. Since temporal resolution is of high importance in testing DUT's, the embodiment of FIG. 1 utilizes prior art pulsed lasers, wherein the laser pulse width determines the temporal resolution of the system. Dual laser source 110 consists of two lasers: a pulsed mode-locked laser, MLL 104, source that is used to generate 10-35 ps wide pulses, and a continuous-wave laser source, CWL 106, that can be externally gated to generate approximately 1 us wide pulses. The MLL 104 source runs at a fixed frequency, typically 100 MHz, and must be synchronized with the stimulus signals 142 provided to the DUT 160, via a phase-locked loop (PLL) on the time-base board 155, and the trigger and clock signals 144 provided by the ATE tester. The output of the DLS 110 is transmitted to the optical bench 112 using fiber optics cable 115. The light beam is then manipulated by beam optics 125, which directs the light beam to illuminate selected parts of the DUT 160. The beam optics 125 consists of a Laser Scanning Microscope (LSM 130) and beam manipulation optics (BMO 135). The specific elements that are conventional to such an optics setup, such as objective lens, etc., are not shown. Generally, BMO 135 consists of optical elements necessary to manipulate the beam to the required shape, focus, polarization, etc., while the LSM 130 consists of elements necessary for scanning the beam over a specified area of the DUT. In addition to scanning the beam, the LSM 130 has vector-pointing mode to direct and "park" the laser beams to anywhere within the field-of-view of the LSM and Objective Lens. The X-Y-Z stage 120 moves the beam optics 125 relative to the stationary DUT 160. Using the stage 120 and the vector-pointing mode of the LSM 130, any point of interest on the DUT 160 may be illuminated and probed.

For probing the DUT 160, the ATE 140 sends stimulus signals 142 to the DUT, in synchronization with the trigger and clock signals provided to the phase-locked loop on the time-base board 155. The phase-lock loop controls the MLL 104 to synchronize its output pulses to the stimulus signals 142 to the DUT. MLL 104 emits laser pulses that illuminate a particular device of interest on the DUT that is being stimulated. The reflected light from the DUT is collected by the beam optics 125, and is transmitted to photodetector 138 via fiber optic cable 134. The reflected beam changes character (e.g., intensity) depending on the reaction of the device to the stimulus signal.

Incidentally, to monitor incident laser power, for purposes of compensating for laser power fluctuations, for example, optical bench 112 provides means to divert a portion of MLL 104 incident pulse to photodetector 136 via fiber optic cable 132.

The output signal of the photosensors 136, 138, is sent to signal acquisition board 150, which, in turn, sends the signal to the controller 170. By manipulation of the phase lock loop on the time-base board 155, controller 170 controls the precise time position of MLL 104 pulses with respect to DUT 160 stimulus signals 142. By changing this time position and monitoring the photosensors signals, the controller 170 can analyze the temporal response of the DUT to the stimulus signals 142. The temporal resolution of the analysis is dependent upon the width of the MLL 104 pulse.

It is also known in the art to perform continuous wave LVP, wherein a continuous wave laser is used to illuminate a device on the DUT and the continuously reflected light is collected. The continuously reflected light contains timing information relating to the response, i.e., switching, of the active device to various stimulus signals. The reflected light signal is continuously converted into electrical signal by a photodetector, e.g., avalanche photodiode (APD), and is amplified. The timing information is contained within the electrical signal and represents detected modulation of the device, which can then be displayed in either the time-domain using an oscilloscope or in the frequency domain using a spectrum analyzer.

When using a CW laser for LVP, the beam is focused onto an active transistor inside a silicon wafer. It happens that the amount of light reflected from the transistor contains is a function of the voltage across the transistor, hence the reflected laser beam carries superimposed on it an amplitude-modulated signal, the envelope of which duplicates the electrical waveform being probed. The reflected light is captured by a photodetector, which converts the amplitude-modulated optical signal back into a copy of the on-silicon voltage waveform. For reference, the change in reflectivity is relatively small, and a typical value may be only 100 parts per million (ppm). Nevertheless, with a low-noise, high-speed detector, and a very high speed oscilloscope, it is possible to reconstruct multi-gigahertz waveforms using this optical probing technique. This technique may be referred to as the "slow laser, fast detector" option, because the laser in this case is CW (i.e. very slow) and the detector and electronics must be very fast.

Conversely, when using the MLL technique, a very fast laser is employed, but with relatively slow electronics. The laser used is a mode-locked laser, which outputs a series of, e.g., 5-ps FWHM pulses at a 100 MHz repetition rate. The optoelectronic detection mechanism may be the same as for the CW, but since the pulse is localized in time to only five picoseconds, each MLL optical pulse takes a very high-speed (~5 ps) sampling of the waveform. Since the pulses only occur every 10 nanoseconds (for a 100 MHz laser) the detection electronics can be relatively slower than the 5-ps optical pulses. In fact, a pulse-picking scheme can be implemented that only lets a single 5-ps optical pulse through, so the detector need only register the brightness of that one pulse every tester loop period, effectively making the detection scheme very slow.

The hidden complexity in both of these schemes is that the signal-to-noise ratio (SNR) of the measurements is very low—typically much less than one—owing to the combination of a weak reflection from the DUT and the relatively low modulation level (about 100 ppm). As a result, many thousands or millions of repeat measurements must be made to bring the SNR level up to a useful level (SNR 10, for instance). Other problems exist for each of these schemes, as follows.

The CW detection scheme starts when the amplitude-modulated CW laser beam reflected from the DUT hits an infrared detector. Typically the intensity of the laser at the detector is 50 to 100 µW, amplitude modulated with a 100 to 500 ppm signal. The biggest two noise sources are the detector's noise-equivalent power (NEP) and shot noise of the laser beam itself, with the former being slightly larger than the latter. The NEP of the detector is about 10 pW/√Hz, and with a good laser the noise of the laser itself is only slightly above shot noise. This gives an output signal, which typically has an SNR<1. It also gives an output signal that has too low of an amplitude to be sent straight into a digitizing oscilloscope, so the detector needs to be followed with an RF amplifier. Fortunately the noise coming out of the detector is so great that the noise contribution of the RF amplifier stage is insignificant. It is worth noting that although the noise of this amplifier is insignificant, the impact of the amplifier's bandwidth on measured signal rise times is significant, and for this reason it would be ideal to eliminate this amplifier from the system.

Typically an oscilloscope is used to sample the reflected waveform. Since the SNR of the waveform is less than one, many waveforms must be averaged together to arrive at a decent output signal. This step is handled by the oscilloscope, which synchronously captures data from repeated tester loops, averages them, and reports a single output that is the modulated waveform.

The main challenge with MLL scheme has to do with allowing only one MLL optical pulse onto the device under test (DUT) during each tester loop cycle. The optical pulse is amplitude-modulated by the DUT, in the same manner as for CW, and returns to a detector. The limitations of the system are the detector noise and the shot noise of the laser. One subtlety of the MLL scheme has to do with the nature of pulsed light. If the average intensity of a CW and an MLL laser are the same, but the power of the MLL pulses is confined in duration to only 5 ps FWHM, then the intensity during those 5 ps is much larger than the CW intensity, which is spread uniformly over time. For instance, if the MLL laser puts out all of it's power in only 5 ps, with the remaining 9995 ps of each 10-ns cycle being dark, then the peak intensity of the MLL beam is approximately 2000 times stronger than the CW beam. It turns out that each MLL measurement thus captures about 2000 times as much information as the CW scheme does, but the compensating tradeoff is that MLL only sampled one 5-ps snapshot of a waveform, while the CW system captured the entire waveform. Thus, it will take 2000 MLL measurements to fill in the 10-ns waveform, whereas the CW can use this time to average 2000 10-ns waveforms in their entirety. These two effects turn out to be a wash, lending no advantage to one method over the other.

Recently the technology of laser voltage imaging has been developed to provide a two-dimensional gray-scale image correlating to voltages at different points in an area of the DUT. More specifically, an LSM is used to raster-scan an area of the DUT and at each point within the area the reflected light, signal is collected and provides a single data value. That is, rather than providing the spectra over a range of frequency band, at each point the amplitude of the signal at a particular frequency spectrum is obtained from the spectrum analyzer. In practice, the spectrum analyzer is set to extract a single frequency of interest (called zero-span), and to provide an output value that is directly proportional to the strength of the received signal at that frequency. Consequently, as the LSM scans the selected area of the DUT, if there is no activity at the frequency of interest, the spectrum analyzer provides low or no output, while if there is activity at that frequency, the spectrum analyzer provides high output. That is, the spectrum analyzer provides an output signal whose amplitude is proportional to the strength of the signal at the selected frequency of interest. This output can be used to generate a map of the scanned area, showing gray-scale levels corresponding to device activity at each point in the scanned area.

While the above systems and methods provide valuable information about the functionality of the DUT, it is desirable to non-invasively obtain further information about the response of various active devices within the DUT.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the present invention provide apparatus and method for laser voltage probing and/or imaging of a DUT. The concept behind the disclosed embodiments is that it's a hybrid scheme employing the fast MLL optical pulses, together with moderately fast electronics. Specifically, rather than employing a pulse picker to select just one MLL optical pulse per tester loop, the embodiments let all pulses through. This amounts to a pulse every 10 ns (100 MHz), but it is possible to digitize such pulses at this rate using high-speed analog-to-digital converters (ADCs). The high volume of data output by the ADC can be collected and processed inside the FPGA, and the relatively smaller amount of processed data—corresponding to the signal—can then be output at a much slower data rate.

In essence, while MLL relies on fast laser and slow electronics and CW relies on slow laser but fast electronics, embodiments of the invention use fast laser and "mid-speed" electronics. Specifically, an MLL laser beam source is used to generate high bandwidth signal, and the electronics employs a light sensor with speed sufficient to be able to separate adjacent reflected pulses. For example, if a 100 MHz MLL is employed, the light sensor needs to be able to relax faster than the 10-ns time between pulses (relaxation time). The mid-speed electronics is configured to capture the modulated amplitude of each laser pulse, so it should have the sampling rate of the MLL. In the example provided, a 100 MHz sampling is required—which is slower than the GHz-level required for CW system. The electronics includes an FPGA chip, which processes all data internally, sending result off-chip only after processing is complete. The result is that, while such a system employs a MHz level electronics, in principle it could have a GHz timing performance like a CW system, since it derives its timing from the high-speed MLL.

In disclosed embodiments the MLL is ever so slightly tunable. For instance, the MLL may have a +/−50 ppm tuning range, meaning it can be operated anywhere from 100,000 MHz+/−5000.0 Hz. This is important for the PLL circuit because it must be able to adjust the pulse timing just enough to ensure that an integer number of 10-ns pulses falls in one tester loop period. In the example of 10-ns pulses, it meant 10.0000+/−0.0005 ns, due to the 50 ppm tuning.

For clarity, consider for example a tester loop that is 100.05 µs long. 100.005 µs is 100005 ns, which is 10000.5 clock periods of 10.0000 ns. 10000.5 is not an integer. In this case we'd need to stretch the clock pulses from 10.000 ns to 10.0005 ns so that exactly 10000 (an integer) number of pulses fills a tester loop period. Once you have an integer number of MLL pulses in a tester loop, you are guaranteed that the pulses will align in the same relative places each tester loop, essentially remaining fixed in time relative to a tester loop.

An apparatus and method for laser probing of a DUT is disclosed. The system enables laser voltage probing and/or imaging and state mapping of devices within the DUT. A selected area of the DUT is illuminated while the DUT is receiving test signals, causing certain active devices to switch. Light reflected from the DUT is collected and is converted into an electrical signal by a photosensor. The output of the photosensor is sampled by an ADC. The output of the ADC is input into a specially programmed FPGA that operates on the signal to provide a multiple-channel output. The multiple channel output is converted by a DAC chip, e.g., providing a separate DAC for each channel of the FPGA. The outputs of the DAC can be handled separately thereby emulating the signals of a plurality of spectrum analyzers. Also, the outputs of the DAC can be handled in pairs, thereby emulating the signals of a plurality of vector analyzers.

Other aspects and features of the invention will become apparent from the description of various embodiments described herein, and which come within the scope and spirit of the invention as claimed in the appended claims.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Various embodiments of the present invention provide apparatus and method for non-invasive, non-contact method for probing active transistors within a selected area of the DUT. These system and method are referred to herein as laser voltage probing (LVP) or laser voltage imaging (LVI). The described methodologies augment the prior art system by combining the benefits of an MLL system with the benefits of a CW system. Various embodiments showing examples of implementation of the system will now be described.

Figures 2, 3, 4:
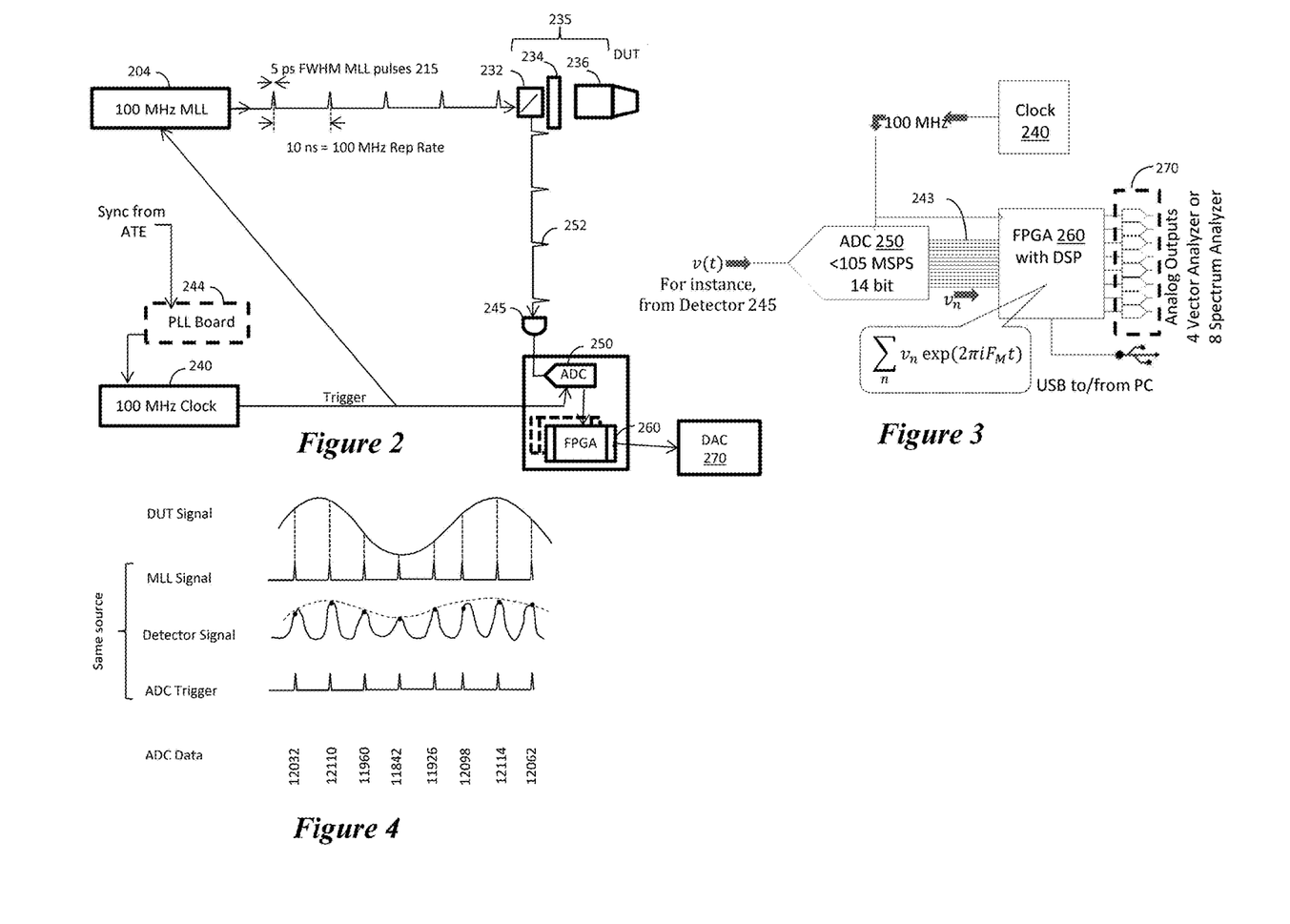
FIG. 2 is a diagram illustrating the main component of a system according to an embodiment of the invention.
FIG. 3 is a schematic illustrating an arrangement of an ADC and FPGA according to one embodiment.
FIG. 4 is a diagram illustrating waveforms of signals generated by the embodiments of FIGS. 2 and 3.

FIG. 2 is a schematic of a system according to an embodiment of the invention for performing laser voltage probing or imaging of DUT. A mode-locked laser 204 generates train of laser pulses 215 according to a trigger signal from a trigger clock 240. In this example the trigger is at 100 MHz, such that pulses 215 have 5 ps FWHM (Full Width at Half Maximum) and are spread at 10 ns pulse to pulse (pulse separation). The BMO 235 include a polarization beam splitter cube PBS 232, a quarter-wavelength plate 234, and an objective 236, arranged in that order from the MLL 204 to the DUT. The laser pulses incident on the DUT are amplitude-modulated and reflected as optical laser signal 252 that is detected by detector (photosensor) 245, which converts the optical signal to an analog electrical signal. The electrical signal from the detector 245 is input into an analog-to-digital converter, ADC 250. The ADC synchronously samples the detector output with the MLL. In the example of FIG. 2, the 100 MHz clock signal is split it in two, one copy is sent to the MLL so it can lock onto this clock, and the other sent to the ADC so that it always samples at the peak of the detector output. In this example, the ADC operates at a rate of 100 MSPS (Million Samples Per Second) per the clock signal. The output of the ADC essentially emulates a sampling oscilloscope and can be used for laser voltage probing (LVP) without the need for an oscilloscope.

In one embodiment, an optional PLL board 244 is used, enabling to move the pulses around with 10 ps or so accuracy. That is, the PLL Board 244 can introduce a delay to the clock pulses with respect to the tester clock pulses. In this manner it is possible to measure waveforms of rather arbitrary size. In one example, shown in FIG. 4, the PLL output is controlling, ever so slightly (e.g., 50 ppm), the frequency. That is, clock 240 is a voltage controlled crystal oscillator with very narrow (+/−50 ppm) tuning range that is controlled by the output of the PLL board 244.

Also, for instance, a first data set is taken and then the laser is shifted, say 5 ns, and another data set is taken, the two dataset can be interleaved to provide 200 MSPS data, which doubles the aliasing frequency. Another side benefit of the PLL board 244 is it locks onto the tester loop clock, and presuming the DUT clock is in some way locked to the tester clock, that means that the "spectrum analyzer" clock (emulated by the ADC 250 and FPGA 260) and the DUT clock will be synchronized, so frequencies measured shouldn't wander around or need to be found, as happens when the tester clock and spectrum analyzer operate off of their respective (and slightly different) time bases.

The Laser Voltage Imaging (LVI) technique shows the physical locations of transistors that are active at a specific frequency. To obtain LVI, generally the signal from the detector is input to a spectrum analyzer. However, in the embodiment of FIG. 2, rather than using a spectrum analyzer, the data from the ADC is input to a specially constructed FPGA 260 (Field-Programmable Gate Array), which may either duplicate LVP waveforms, or can act as a spectrum analyzer for LVI measurements. In one embodiment the LPGA performs a predefined decomposition operation on the sampling, such as, e.g., a FFT (Fast Fourier Transform). One example is the Spartan-6 FPGA, available from Xilinx of San Jose, Calif. The Spartan-6 contains up to 180 DSP building blocks, can be programmed for 18×18 signed multiplication with 48-bit Accumulator, and the DSPs can operate up to 400 MHz with pipelining. Determinations of Sine/Cosine, Log, and Sum-of-Squares can be done with lookup tables. This example is advantageous in that when the FPGA calculates the FFT, it calculates the entire FFT. In other words, one may display, monitor or investigate the signal at one, two, or even 1000 frequencies—the data is all there.

FIG. 3 is a schematic illustrating an embodiment of the ADC 250 and FPGA 260. In the example of FIG. 3, the ADC operates at 14 bit and outputs less than 105 MSPS. ADC 250 receives as input the sync clock signal from clock 240 (which may be the ATE clock signal). In the example of FIG. 3, the clock signal is at 100 MHz—the same as the MLL. ADC 250 also receives as an input the signal v(t) from the detector 245. In this example, the ADC output is 14 bit fed into a parallel bus. The output of the ADC, designated as $v_n$, is input to the FPGA 260. The FPGA operates on $v_n$, as shown in the dotted-line callout of FIG. 3, so as to output multiple digital signals. The multiple signals can then be applied to digital to analog converter 270, so as to output analog signals that basically emulate vector analyzer or spectrum analyzer signals. As shown in FIG. 3, the DAC 270 can be constructed in the form of a single chip having multiple channels, each channel operating on one of the outputs of the FPGA 260, wherein each channel correspond to one output of the ADC 250. In the embodiment illustrated, the FPGA outputs eight channels, so that an eight-channel DAC 270 chip can be used. The signals can be operated in pairs so as to provide four outputs emulating four vector analyzers (i.e., (x,y) or (r,θ) of four vector analyzers), or each channel may be independent so as to emulate the output of eight spectrum analyzers.

FIG. 4 illustrates plots of the various signals and the ADC output data for each pulse. The top wave is the DUT signal that is probed. Below it is the MLL laser pulses, and just below that is the output of the detector signal. Below the detector signal is the ADC trigger pulses, which are synchronized with the MLL pulses. For each ADC trigger pulse (clock), and ADC data output is provided below the ADC trigger.

According to one embodiment, a detector that is midway in performance between MLL detector and CW detector can be used. For example, a detector with approximately 1 GHz performance is adequate. That is, unlike the CW system, there is no need for a 10- or 20-GHz detector. On the other hand, the slow detector that is usually employed by an MLL system cannot be used, since it will not clear fast enough to receive all of the pulses. Unlike prior art where only one pulse per tester loop period is passed to the photosensor, in this embodiment all of the MLL optical pulses are let pass through, so it needs a detector that is just fast enough so that there is no memory of the previous pulse when new pulse is captured. Thus the detector needs to "clear itself" of the previous pulse in 10 ns, which is the period of the MLL. A 1 GHz detector accomplishes this fairly well.

One example for an adequate detector is Model 1611FC-AC, sold by Newport Corporation of Irvine, Calif. This detector is an InGaAs photoreceiver, which operates from 30 kHz to 1 GHz with an NEP of 20 pW/√Hz. The expected performance of this detector in one embodiment is calculated as follows. The detector is assumed to receive a 100 μW return beam that is modulated by a DUT waveform at the 200 ppm level. A 100 μW MLL running at 100 MHz outputs 1 pJ per optical pulse. Since the responsivity of the chosen detector is 1 A/W, the detector will generate 1 pC of charge per pulse, which is $6.25 \times 10^6$ electrons. If the MLL is shot-limited, there will be, on average, a 1-σ RMS variation of $\sqrt{(6.25 \times 10^6)}=2500$ electrons per pulse. Separately, the detector noise equivalent power is 20 pW/√Hz×√1 GHz=632 nW, times the conversion gain of 700 V/W equals 443 μV RMS.

As for the optical pulse itself, the detector rise and fall times are specified at 400 ps each, so assume the 1 pC of charge is spread out over 800 ps, which will result in a detector output of:

$$V = \frac{1 pC}{800 \text{ ps}} \times 700 \Omega = 0.875 \text{ V}. \quad (1)$$

The noise on this measurement will consist of the 443 μV contribution from the detector's NEP, plus the shot noise contribution, which is 350 μV. These add in quadrature to give an RMS noise level of 564 μV.

The signal on this measurement is assumed to be 200 ppm, thus we expect a signal S=200 ppm×0.875V=175 μV.

Taking all of these things together, we're left with 875 mV pulses, atop of which rides a 175 μV signal and 564 μV noise. Thus the SNR is 175/564=0.31, and it will take $N=564/(175/10)^2=1038$ averages to make this measurement have an SNR of 10. However, using this embodiment, the signal of the photosensor can be sampled directly by the ADC 250, without the use of an amplifier—as is done in the prior art. In general, all amplifiers add some noise to the signal, but in practice there is so much noise coming out of the detector that the tiny bit of excess noise added by the amplifier doesn't amount to anything. One might be tempted to think, therefore, that there's no downside to adding the amplifier. But that is wrong, because even though the amplifier adds no noise, its finite bandwidth slows down all the high-speed edges coming out of the detector. So it may be virtually noiseless, but for instance a 40 picosecond edge coming out of the detector will be broadened to a little over 50 picoseconds by an amplifier with a 10 GHz bandwidth. To avoid that, in the embodiments of FIGS. 2 and 3 the signal of the photosensor is sampled directly by the ADC without an intervening amplifier. Of course, if the broadening of the edge is of no or little significance, an amplifier may be inserted between the photosensor and the ADC so as to amplify the signal before it is sampled by the ADC.

Figure 5:
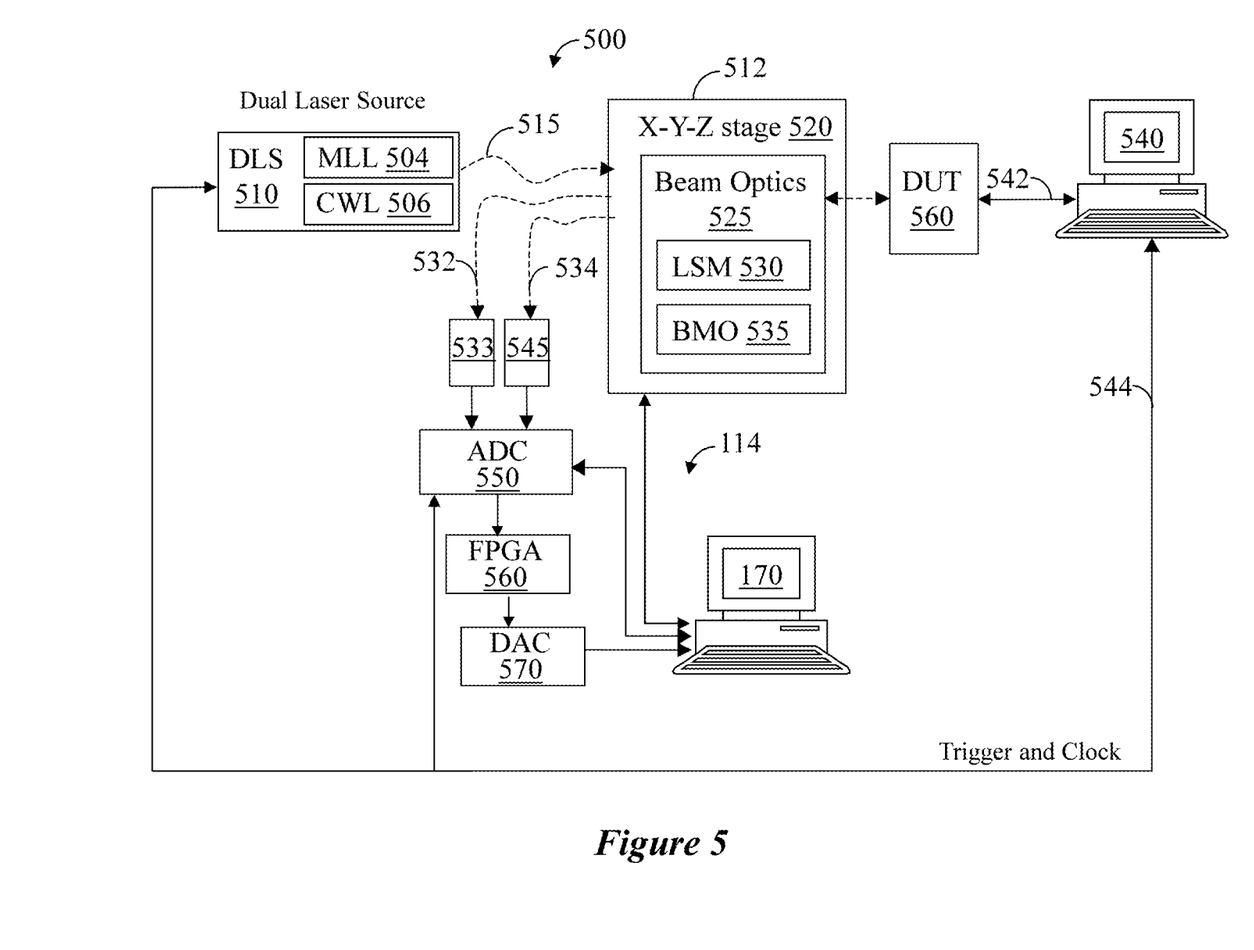
FIG. 5 is a general schematic illustrating an embodiment utilizing a dual laser source having an MLL laser and a CW laser.

FIG. 5 is a general schematic illustrating an embodiment utilizing a dual laser source 510 having an MLL laser 504 and a CW laser 506. In FIG. 5, elements that are similar to element of FIG. 1 have the same reference, except that they are in the 5xx series. These elements will not be described again, except insofar as necessary to understand the embodiment of FIG. 5.

The embodiment of FIG. 5 enables performing laser voltage probing/imaging using either MLL or CW laser. Testing using the MLL illumination is done in the same manner as described with reference to FIGS. 2-4. In the case of MLL, sensor 545, which is similar to sensor 245 of FIG. 2, is used to collect the reflected beam. Conversely, when using the CW laser 506, a faster sensor may be used. Sensor 533 may be, e.g., a 9 GHz sensor, i.e., about an order of magnitude faster than sensor 545. The output of the sensor 533 is sent to the ADC 550 to be sampled based on a clock signal, which may or may not be locked to the tester sync signal.

As shown in FIG. 5, the CW laser may be a laser having wavelength of 1064 nm or a laser with wavelength of 1310 nm. It is noted that when using a CW laser of 1064 nm wavelength, the continuous laser beam may generate electron-hole pairs inside the DUT, thus interfering with the testing. Therefore, a 1310 nm wavelength is preferred for this embodiment, since a continuous beam of 1310 nm does not generate electron-hole pairs and all the signals from the sensor can be used. An example of a set up for using the CW laser is illustrated in FIG. 6.

Figure 6:
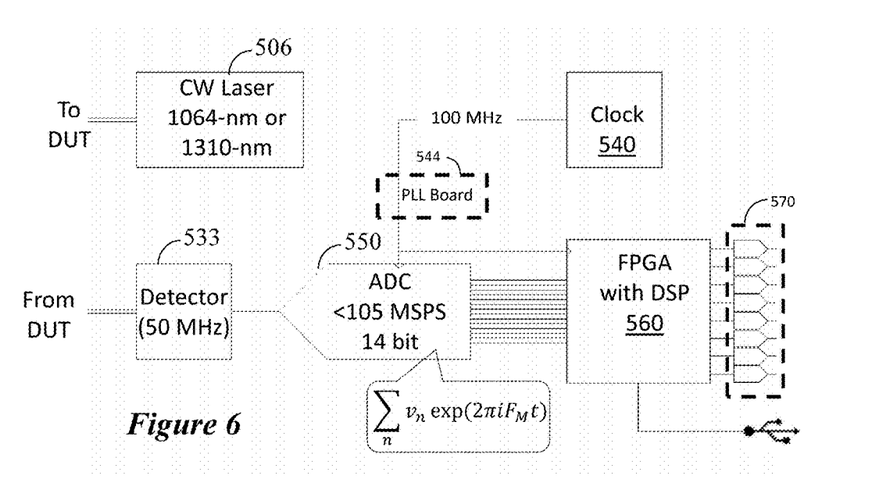
FIG. 6 illustrates an embodiment for the arrangement of an ADC and FPGA using a CW laser which may be used with the embodiment of FIG. 5.

In FIG. 6, the laser beam from CW laser source 506 is reflected from the DUT and sensed by sensor 533, in this example operating at 50 MHz. The output of the sensor is sampled by ADC 550 at the clock rate, which in this example is 100 MHz. The clock signal is input to the ADC 550 from clock 540, which may be the same clock used for the MLL 504. The clock signal may be shifted using optional PLL Board 544. The output of the ADC 550 is sent to the FPGA 560 which, in this case outputs eight channels. As shown in the callout, the FPGA 560 operates on the output of the ADC 550 and, in this example, output eight channels.

Figure 7:
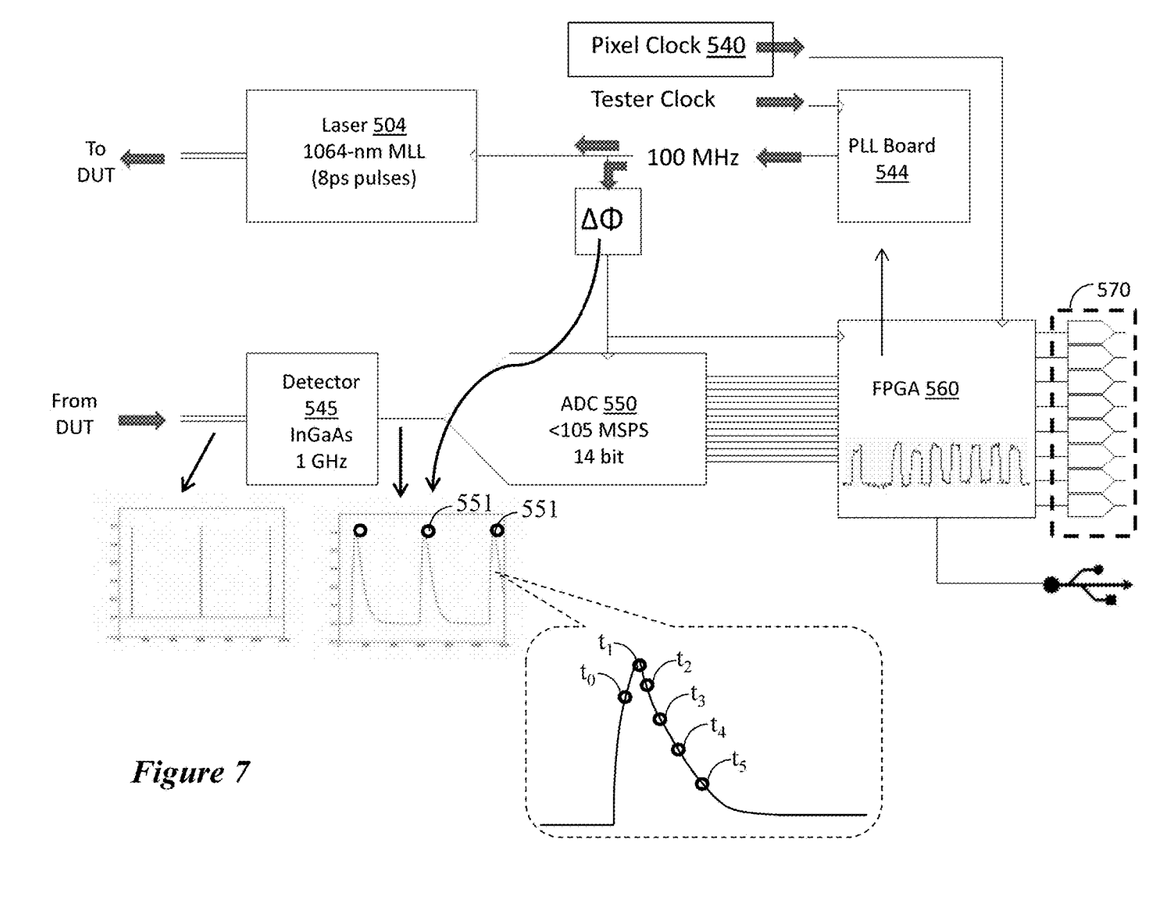
FIG. 7 illustrates an embodiment for the arrangement of an ADC and FPGA using a MLL laser which may be used with the embodiment of FIG. 5.

FIG. 7, illustrates an example of a set up for using the MLL laser of FIG. 5. The MLL laser 504 generates pulses according to the clock signal from clock 540. In the example of FIG. 7, the system also receives the tester clock signal and a PLL board 544 can be used to synchronize or shift the clock signal from the clock 540 with respect to the tester clock, which is graphically indicated by the boxed ΔΦ. Sensor 545 is used to detect the pulses reflected from the DUT. In this example sensor 545 is an InGaAs photosensor operating at 1 GHz. The signal output from the sensor 545 is sampled directly by ADC 550 according to the clock signal from clock 540. This is indicated graphically by dots 551 placed over the waveform of the sensor 545 signal.

Figure 8:
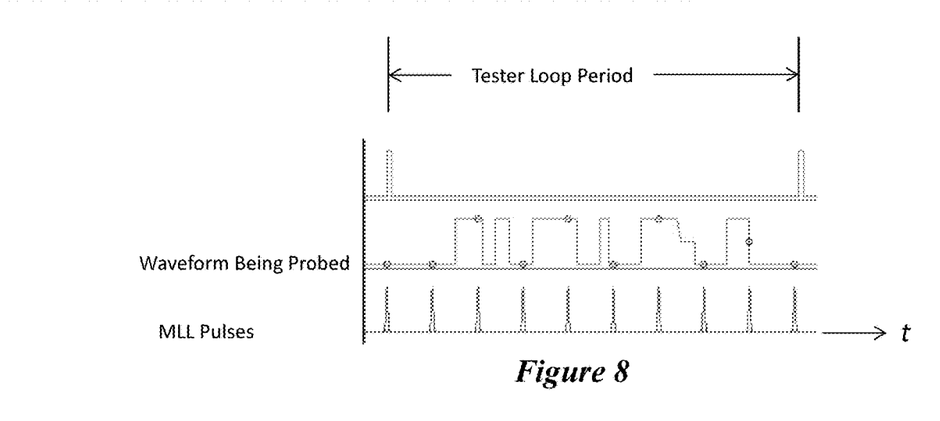
FIG. 8 is a diagram illustrating waveforms of signals generated by the embodiments of FIGS. 5 and 7.

That is, by using the PLL Board 544, the timing of the sampling can be shifted with respect to the tester clock. This is diagrammatically illustrates in the callout, wherein in a first test loop, the multiple of sampling, say, 1000, are taken when the PLL board 544 sets the sampling clock to a first position, $t_0$, with respect to the tester clock. The sampling is depicted schematically in FIG. 8. These samples can be averaged to give a certain average value for each sampled location. Then, a second run is done, wherein the PLL board 544 sets the sampling clock to a second position, $t_1$, in this example, a bit retarded with respect to the tester clock. Another set of samples is taken and averaged. This can be repeated a number of times, and the average values can be used to reconstruct the actual waveform output from the sensor 545. As before, the output of the ADC 550 is sent to the FPGA 560, and its output is converted by multiple DACs 570.

The above description provides examples of emulating spectral and vector analyzer output from the 8 DACs; however, according to other embodiments the FPGA is preprogrammed to perform temporal averaging and enable near real time generation of waveforms. Such an embodiment can be used, for instance, to perform scan chain debugging. In this application, an ATE injects a repetitive series of ones and zeroes into a scan chain, at a fairly low rate—usually below 20 MHz. A very typical scan chain debug injects "1, 1, 0, 0" signals that repeat indefinitely, thus if the ATE sends these signals to the DUT at a 10 MHz rate, the cycles repeat 2.5 million times per second. The disclosed arrangement of ADC and FPGA can grab this signal, which of course will have poor (SNR<1) fidelity, but since the signal repeats so often, the FPGA can perform the average of many successive periods of the scan chain signal and very rapidly obtain a high SNR copy of the waveform in the scan chain.

As an example, in just one millisecond, 2500 averages can be performed for the case of "1 1 0 0" injected into the DUT at 10 MHz, and if this averaged signal is spit out of the FPGA using a high-speed DAC (100 MSPS), then a near "live" image of the waveform results. Basically the user cannot tell a 1 ms delay, so everywhere the user points the laser beam at, the user gets a nearly live image of the waveform being probed.

The testing method according to this embodiment would proceed as follows. The ATE would be programmed to send out a scan chain debug signal consisting of a repetitive series of ones and zero bits. The series should consist of a small number of ones and zeros, for example, four bits, eight bits, etc. The FPGA 260 is preprogrammed to average the signal it receives from the ADC 250. Here again, the ADC 250 may send its output as 14 bit words on a parallel bus 243. The laser is then parked on a first location on the DUT and the scan chain debug signal is applied to the DUT. The reflected signal is collected and the FPGA 260 averages the signal as received from the ADC 250. When sufficient signal is collected, say after one millisecond or so, the beam is moved to the next location. At this point, the FPGA 260 sends the resulting averaged waveform from the previous location to the DAC 270, and commences averaging the signal for the new location. This is repeated as many times as needed so as to scan any desired area of the chip.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A method, comprising:
   illuminating a selected area of a device under test (DUT) with laser pulses from a mode locked laser (MLL) while the DUT is receiving test signals;
   collecting reflected portions of the laser pulses from the selected area of the DUT;
   converting the reflected portions of the laser pulses into a corresponding electrical signal with a photodetector having a relaxation time that is less than a MLL laser pulse separation associated with a MLL pulse repetition rate; and
   sampling the electrical signal at a sampling clock rate corresponding to the MLL pulse repetition rate to produce an associated digital output.

2. The method of claim 1, wherein the test signals are applied at a tester clock rate.

3. The method of claim 1, further comprising, performing a fast Fourier transform (FFT) on the digital output.

4. The method of claim 1, wherein providing the digital output comprises providing plurality of digital signals over a plurality of channels.

5. The method of claim 4, further comprising generating a plurality of laser voltage testing signals over a plurality of field programmable gate array (FPGA) channels based on the plurality of digital signals, wherein the laser voltage testing signals are associated with switching states of active devices within a selected area of the DUT.

6. The method of claim 5, further comprising applying each of the plurality of laser voltage testing signals to a digital to analog converter (DAC).

7. The method of claim 6, wherein each pair of the plurality of laser voltage testing signals is configured to emulate output of a vector analyzer.

8. The method of claim 7, wherein each pair of the plurality of laser voltage testing signals comprises an (R-Θ) pair or an (X,Y) pair.

9. The method of claim 6, wherein each of the plurality of laser testing signals is configured to emulate a spectrum analyzer output.

10. The method of claim 1, further comprising applying test signals to the DUT at a tester clock rate.

11. The method of claim 10, wherein the MLL pulse repetition rate is an integer multiple of the tester clock rate.

12. The method of claim 10, wherein sampling the electrical signal comprises applying the electrical signal directly to an analog to digital convertor (ADC) without an intervening amplification.

13. The method of claim 11, further comprising shifting the sampling clock signal with respect to the tester clock.

14. The method of claim 1, further comprising:
operating an automated test equipment (ATE) to send a scan chain debug signal having a repetitive series of bits such that the DUT receives a repetitive test signal corresponding to the scan chain debug signal so that at least one active device switches states repetitively; and
averaging successive periods of the digital output signal corresponding to the scan chain debug signal.

15. The method of claim 2, further comprising:
based on the digital output, generating laser voltage testing signals associated with at least one active device within the selected area of the DUT.

16. The method of claim 2, further comprising coupling a sampling clock to the MLL to establish the MLL pulse repetition rate.

17. The method of claim 16, wherein the sampling clock rate and the MLL laser pulse repetition rate are the same.

18. The method of claim 15, further comprising varying pulse delays of sets of the MLL pulses with respect to the test signals applied at the tester clock rate such that the electrical signal is sampled at the sampling clock rate with corresponding sampling delays.

19. The method of claim 18, wherein the sampling clock rate is an integer multiple of the tester clock rate.

20. The method of claim 19, further comprising averaging digital signal portions associated with common respective MLL pulse delays to produce an averaged digital signal.

21. A system, comprising:
a mode locked laser (MLL) providing a train of laser pulses having a selected pulse separation time;
beam optics configured to direct the laser pulses onto a selected area of a device under test (DUT) and collect reflected pulses from the DUT;
a photosensor configured to receive the reflected pulses from the DUT and output an electrical signal corresponding to the reflected pulses, wherein the photosensor is configured to have a relaxation time shorter than the selected pulse separation time; and
an analog to digital converter (ADC) electrically coupled to the photosensor to sample the electrical signal at a sampling rate corresponding to the MLL pulse separation.

22. The system of claim 21, further comprising a phase locked loop (PLL) electrically coupled to the MLL and the ADC, and situated to receive a clock signal associated with the sampling rate and a sync signal associated with a test signal applied to the DUT, and shift the clock signal with respect to the sync signal.

23. The system of claim 21, wherein the ADC is directly electrically connected to the photosensor without an intervening amplifier.

24. The system of claim 22, wherein the sampling rate is an integer multiple of a sync signal rate.

25. The system of claim 22, further comprising a field programmable gate array (FPGA) electrically coupled to the ADC and configured to receive and operate on the digitized output from the ADC and output a laser test signal corresponding to switching states of at least one active device within the selected area of the DUT.

26. The system of claim 25, wherein the FPGA performs a predefined decomposition operation on the digitized output.

27. The system of claim 25, wherein the FPGA performs a fast Fourier transform (FFT) on the digitized output.

28. The system of claim 25, further comprising a digital to analog converter (DAC) electrically coupled to the FPGA and configured to convert output of the FPGA.

29. The system of claim 25, wherein the ADC outputs a plurality of digital outputs over a plurality of channels and wherein the FPGA is configured to operate on the digital outputs using a plurality of processing channels.

* * * * *